(12) United States Patent
Kelkka et al.

(10) Patent No.: US 12,501,541 B2
(45) Date of Patent: Dec. 16, 2025

(54) EMBEDDED BUSBARS FOR LOAD SWITCHING

(71) Applicant: IONCOR LTD, Uusikaupunki (FI)

(72) Inventors: Juuso Kelkka, Uusikaupunki (FI); Toni Karsikas, Uusikaupunki (FI)

(73) Assignee: IONCOR LTD, Uusikaupunki (FI)

( * ) Notice: Subject to any disclaimer, the term of this patent is extended or adjusted under 35 U.S.C. 154(b) by 161 days.

(21) Appl. No.: 18/541,849

(22) Filed: Dec. 15, 2023

(65) Prior Publication Data

US 2024/0206049 A1    Jun. 20, 2024

(30) Foreign Application Priority Data

Dec. 19, 2022 (EP) ..................... 22214620

(51) Int. Cl.
*H05K 1/02* (2006.01)
*G01R 19/165* (2006.01)
*H05K 3/34* (2006.01)

(52) U.S. Cl.
CPC ..... *H05K 1/0263* (2013.01); *G01R 19/16571* (2013.01); *H05K 1/0203* (2013.01); *H05K 3/341* (2013.01); *H05K 2201/10053* (2013.01); *H05K 2201/10272* (2013.01)

(58) Field of Classification Search
CPC ............... H05K 1/0263; H05K 1/0203; H05K 2201/10053; H05K 2201/10272
See application file for complete search history.

(56) References Cited

U.S. PATENT DOCUMENTS

| | | | |
|---|---|---|---|
| 8,153,290 B2 | 4/2012 | Hermann et al. | |
| 8,313,855 B2 | 11/2012 | Muis | |
| 8,354,186 B2 | 1/2013 | Muis | |
| 8,968,949 B2 | 3/2015 | Hermann et al. | |
| 9,440,601 B2 | 9/2016 | Soleski et al. | |
| 10,356,926 B1* | 7/2019 | Singh | H05K 1/0203 |
| 2001/0012708 A1* | 8/2001 | Mizuno | H05K 7/026 |
| | | | 439/76.1 |
| 2018/0226315 A1* | 8/2018 | Gottwald | H01L 24/20 |
| 2020/0357717 A1* | 11/2020 | Maier | H01L 23/3675 |
| 2021/0273533 A1 | 9/2021 | Weiss et al. | |

FOREIGN PATENT DOCUMENTS

| | | |
|---|---|---|
| CN | 101809785 A | 8/2010 |
| CN | 203327376 U | 12/2013 |
| CN | 206401418 U | 8/2017 |
| CN | 108346767 A | 7/2018 |
| CN | 207625909 U | 7/2018 |

(Continued)

OTHER PUBLICATIONS

Extended European Search Report mailed Mar. 7, 2023 for corresponding EP Application No. 22214620.1 (7 pages).

*Primary Examiner* — Sherman Ng
(74) *Attorney, Agent, or Firm* — Christopher R. Carroll; The Small Patent Law Group LLC (57) ABSTRACT

Disclosed is a printed circuit board (PCB) for load switching between an electric power supply and one or more loads. The PCB comprises a PCB body, a busbar embedded into the PCB body for acting as a heat sink and one or more switches for the load switching, wherein the one or more switches are coupled to the busbar for routing an electric current for the load switching through the busbar.

13 Claims, 5 Drawing Sheets

(56) References Cited

FOREIGN PATENT DOCUMENTS

| | | | |
|---|---|---|---|
| CN | 110417394 | A | 11/2019 |
| CN | 210380801 | U | 4/2020 |
| EP | 2226870 | A1 | 9/2010 |
| EP | 3352305 | A1 | 7/2018 |
| EP | 3352322 | A1 | 7/2018 |
| EP | 3965207 | A1 | 3/2022 |
| EP | 4053874 | A1 | 9/2022 |
| WO | 2009016491 | A2 | 2/2009 |
| WO | 2015034585 | A1 | 3/2015 |
| WO | 2015034586 | A1 | 3/2015 |
| WO | 2015034595 | A1 | 3/2015 |
| WO | 2015034596 | A1 | 3/2015 |
| WO | 2015034597 | A1 | 3/2015 |
| WO | 2015034599 | A1 | 3/2015 |
| WO | 2015034634 | A1 | 3/2015 |
| WO | 2015034661 | A1 | 3/2015 |
| WO | 2015034662 | A1 | 3/2015 |
| WO | 2015034704 | A1 | 3/2015 |
| WO | 2015035016 | A2 | 3/2015 |
| WO | 2015035017 | A1 | 3/2015 |
| WO | 2015035018 | A1 | 3/2015 |
| WO | 2015035021 | A1 | 3/2015 |
| WO | 2015035023 | A1 | 3/2015 |

\* cited by examiner

EMBEDDED BUSBARS FOR LOAD SWITCHING

CROSS-REFERENCE TO RELATED APPLICATIONS

This application claims priority to European Patent Application No. 22214620.1 (filed 19 Dec. 2022), the entire disclosure of which is incorporated herein by reference.

TECHNICAL FIELD

The present disclosure relates to load switching. In particular, the disclosure relates to load switching for battery packs, which may be configured for powering an electric vehicle.

BACKGROUND

Traditionally, load switching units have been designed with mechanical main contactors to handle the large electric currents involved. However, such mechanical contactors typically take up a lot of space. Additionally, in particular for electric vehicles, discharge currents from a single battery module may exceed hundreds of amperes and unrestricted short circuit currents may exceed thousands of amperes. With the proliferation of these technologies, improved solutions for load switching are demanded.

OBJECTIVE

An objective is to provide an improvement over the state-of-the-art solutions for load switching, in particular for battery packs, which may be configured for powering an electric vehicle.

SUMMARY

In a first aspect, a printed circuit board (PCB) for load switching between an electric power supply and one or more loads is provided. The PCB comprises a PCB body, which can be used for supporting a plurality of electronic components. The PCB also comprises a busbar embedded into the PCB body for acting as a heat sink, which allows heat generated from load switching to be transferred across the PCB body. The PCB comprises one or more switches for the load switching, wherein the one or more switches are coupled to the busbar for routing an electric current for the load switching through the busbar.

Since the busbar is embedded into the PCB body, the switch(es) can be coupled to the busbar without feedthrough connections. This, in turn, allows improving the heat transfer coefficient between the switch(es) and the busbar. Such a non-penetrating connection from the switch(es) to the busbar allows minimizing the number of heat transfer interfaces, each of which has their own heat transfer coefficient. Also, under transient load, such as a cyclical load, all additional inductances can cause increased losses leading to increased need of cooling. Feedthrough connections through the PCB body would cause such additional inductances, which can be avoided with the embedded busbar. Increased heat transfer and lowered inductance (in comparison to coupling with feedthrough connections) together allow increased current carrying capacity for the connection between the switch(es) and the busbar and thereby for a load switching unit utilizing the PCB. The solution also allows improved manufacturing efficiency as the ease of manufacture is improved. No boring for feedthrough connections are required.

The switch(es) being coupled to the busbar allows routing an electric current for the load switching across the PCB through the busbar. The busbar therefore does not simply function as a heat sink but also as a current conductor for the load switching, e.g. from a battery pack via the busbar to a dc link of an electric vehicle. This can allow the PCB to support elevated currents through the busbar, in particular for load switching of drive batteries for an electric vehicle. In some applications for example, this can amount to charge and/or discharge currents of over 500 amperes, e.g. up to 600 or 1000 A, for a single battery module.

In an embodiment, the one or more switches are directly attached to the busbar, for example as surface mount(s). This allows minimizing heat transfer interfaces. Consequently, it allows improving the heat transfer and omitting excess inductance between the switch(es) and the busbar, thereby increasing current carrying capacity of the connection. Since no feedthroughs are required, excess inductances can be eliminated allowing improved electrical contact between the busbar(s) and the switche(es), in particular under transient load. Additionally, heat distribution from one side of the PCB body to another is thus improved, as is the cooling of relevant components, or the switch(es) in particular.

In an embodiment, the one or more switches are soldered to the busbar. This has been found to allow a good contact for reliability and improved current carrying capacity.

In an embodiment, the busbar extends throughout the thickness of the PCB body. This facilitates reliability with ease of manufacture.

In an embodiment, the thickness of the busbar is substantially equal to the thickness of the PCB body. This facilitates reliability with ease of manufacture.

In an embodiment, the PCB comprises a connection to a cooling element, the connection being configured in thermal contact with the busbar. This allows heat to be extracted from the busbar to improve performance for load switching.

In an embodiment, the connection comprises a layer of electrically insulating thermal interface material. This allows heat to be extracted from the busbar while reducing its effect to the electric current in the busbar.

In an embodiment, the one or more switches are semiconductor switches. This allows improved speed and current capacity for the load switching.

In an embodiment, the busbar is a copper busbar. This has been found to provide efficiency in various applications.

In an embodiment, the PCB comprises one or more press-fit screw terminals on the PCB body and/or the busbar for routing the electric current from the PCB. This allows improved thermal performance and reliability, in particular under cyclic load conditions.

Cyclic loading is a common characteristic of moving machinery applications. Especially high current cyclic load results in wide temperature cycling of current carrying components. This is especially problematic with screw connections having sandwiched PCB body, e.g. of FR4 PCB material, in between. The thermal expansion and subtraction of the PCB body combined with the vibration of the application can cause loosening of the current carrying joint, ultimately resulting in increasing series resistance and inevitably more heat losses.

When ultimate reliability and robustness is required from a high current carrying joint, two materials with considerably differing thermal expansion properties should not be fixed together with screws. This is due to the fact, that in a crew connection, the series resistance of the joint is a function of the surface pressure parallel to the longitudinal axis of the screw. The surface pressure in turn varies depending on the thermal expansion properties of the joined materials. A press-fit joint, on the other hand, can markedly mitigate suffering from increased series resistance because the joining pressure can be directed in an axis perpendicular to the thickness of the PCB.

Press-fit screw terminal(s) on the PCB body and/or the embedded busbar can be used for interfacing with one or more busbars external to the PCB. In addition to the apparent robustness for harsh environments, the press-fit screw terminal(s) can also provide a heat conduction path to one or more cooling elements for the busbar(s).

In an embodiment, the PCB comprises a current measuring element together with processor and/or a comparator coupled to the one or more switches and to the busbar via the current measuring element for facilitating opening any or all of the one or more switches when an electric current at the current measuring element exceeds a threshold value. This allows the busbar to be utilized for providing an electronic fuse. In a further embodiment, the current measuring element comprises a shunt resistor, which may be directly attached to the busbar.

In a second aspect, a load switching unit (LSU) for an electric vehicle is provided. The LSU comprises one or more PCBs according to the first aspect, optionally in any combination with its embodiments, for load switching between a battery pack of the electric vehicle and a dc link of the electric vehicle.

In a third aspect, an electric vehicle comprising one or more batteries for propulsion of the electric vehicle and the PCB according to the first aspect, optionally in any combination with its embodiments, for load switching for the one or more batteries.

In a fourth aspect, method of providing a printed circuit board (PCB) for load switching between an electric power supply and one or more loads is provided. The method comprises embedding a busbar into a PCB body for acting as a heat sink. The method may further comprise coupling one or more switches to the busbar for routing an electric current for the load switching through the busbar.

The solution as disclosed herein may be used, for example, for carrying the load current of a battery through switch(es) assembled on the embedded busbar(s) to provide an improved cooling path for heat extraction, e.g. for a semiconductor die, while providing cross-sectional area for elevated current flow. The solution allows high-performance cooling to match the high-current capability of semiconductor switches such as MOSFET switches, in particular. The full load current of a battery pack may be routed through such switches and the embedded busbars.

The disclosed solutions allow increased continuous electric currents to be routed for load switching. This can mean electric currents of 100 amperes or more, for example a minimum of 200 or 300 amperes for continuous electric current. On the other hand, the solutions also allow increased fault current tolerance, allowing fault currents of 1000 amperes or more to be reliably switched off.

It is to be understood that the aspects and embodiments described above may be used in any combination with each other. Several of the aspects and embodiments may be combined together to form a further embodiment of the invention.

BRIEF DESCRIPTION OF THE DRAWINGS

The accompanying drawings, which are included to provide a further understanding and constitute a part of this specification, illustrate examples and together with the description help to explain the principles of the disclosure. In the drawings.

Like references are used to designate equivalent or at least functionally equivalent parts in the accompanying drawings.

DETAILED DESCRIPTION

The detailed description provided below in connection with the appended drawings is intended as a description of examples and is not intended to represent the only forms in which the example may be constructed or utilized. However, the same or equivalent functions and structures may be accomplished by different examples.

Figure 1A:
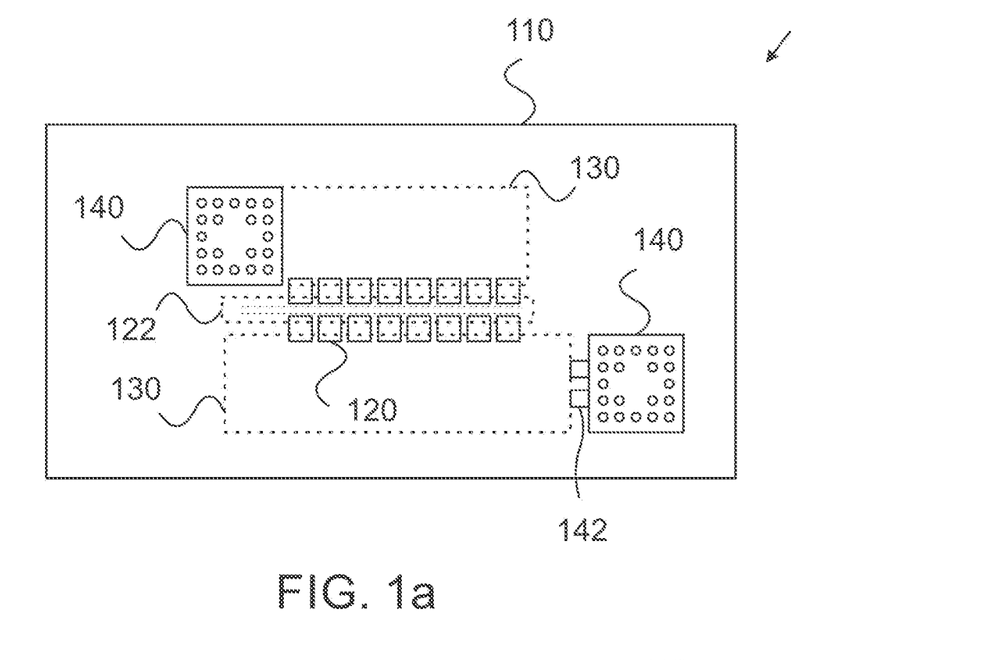
FIGS. 1a and 1b illustrate a PCB according to an example in a top-down and bottom-up view.
Figure 1B:
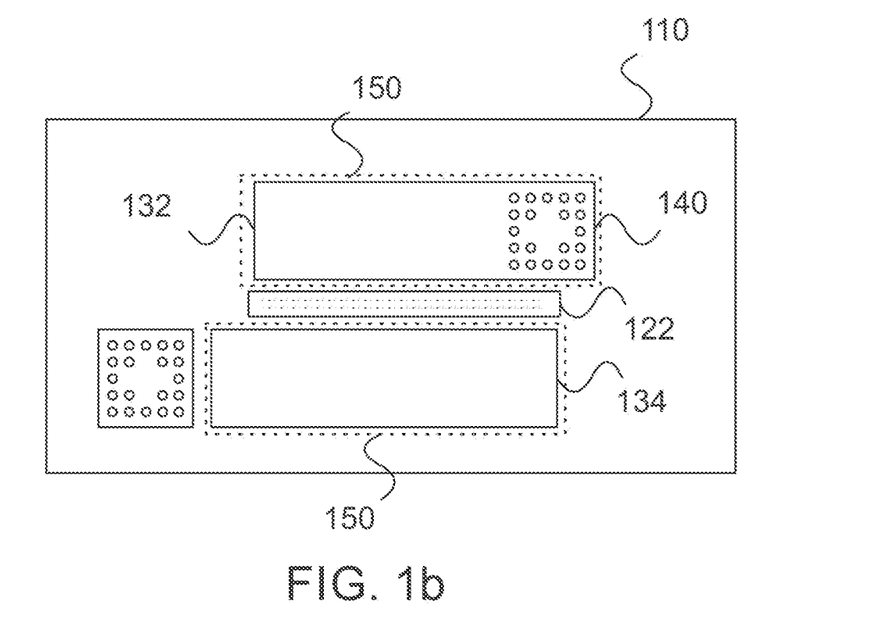

FIGS. 1a and 1b illustrate a PCB 100 according to an example in a top-down and bottom-up view. The PCB comprises a PCB body 110, which may be provided as any type of a printed circuit board body available to a person skilled in the art. In particular, the PCB body may be provided as an inlay board. The PCB body allows mechanically supporting and electrically connecting electronic components. It may comprise a non-conductive substrate. It may also comprise multiple conductive pathways, which may be provided on the substrate. For example, the PCB body may be provided as a copper clad laminate. An example of material for the PCB body is FR4 but other materials may also be used. The PCB may be a single-sided PCB or a double-sided PCB so that electronic components may be electrically connected on both sides of the PCB body. The PCB body may be a single-layer PCB body or a multi-layer PCB body and, accordingly, the PCB may be a single-layer PCB or a multi-layer PCB, having two or more PCB layers in the PCB body. In an example, the PCB body has four or more PCB layers.

The PCB 100 is configured for load switching between an electric power supply and one or more loads. This may involve repeatedly attaching and/or detaching the load(s) to/from the power supply. For the load switching, the PCB comprises one or more switches 120, such as semiconductor switches. The In particular, the one or more switches may comprise or consist of MOSFET switches. Also for said purpose, the PCB comprises one or more busbars 130 embedded into the PCB body 110 for acting as a heat sink. The busbar(s) may be additionally configured so that electric current may be transmitted from the electric power supply to the one or more loads via the busbar(s). For this purpose, the switch(es) may be coupled to the busbar for routing the electric current for the load switching through the busbar(s). The PCB may be configured for load switching for example for voltage levels of 48V but also higher, e.g. up to 400V or 1 kV.

The busbar(s) 130 are made of electrically and thermally conductive material such as metal, in particular copper, for transmitting the electric current. The busbar(s) can be oriented parallel to the PCB body so that the electric current can be routed along the PCB body through the busbars. In addition, the busbar(s) may be configured for routing the electric current perpendicular to the PCB body by routing the electric current through the PCB body. This allows contacts for transmitting the electric current to be provided on both sides of the PCB body. Even in this case, the busbar(s) may be considered as substantially two-dimensional electric current and heat carrying element(s). They may be provided as so-called coins, e.g. copper coins. The busbar(s) may be rectangular in shape, but other shapes are also possible.

The PCB 100 may comprise two or more busbars according to any of the examples described herein. These busbars may be coupled to the switch(es) 120 for routing the electric current for the load switching through the two or more busbars. The switch(es) may be configured for bridging the two or more busbars for routing the electric current across the two or more busbars. For example as illustrated in FIG. 1a, two busbars may be bridged by the switch(es) through a switching interface 122, in particular with the switches, such as MOSFET switches, arranged pairwise into a back-to-back configuration. In general, any of the known load switching means and techniques available to a person skilled in the art may be used.

The PCB 100 may comprise one or more interfaces 140 for transmitting the electric current to and/or from the PCB. In particular, the PCB may comprise one or more interfaces for facilitating transmission of the electric current to the PCB from the electric power supply, such as one or more battery packs, in particular of an electric vehicle. The PCB may also comprise one or more interfaces for facilitating transmission of the electric current from the PCB to the one or more loads. In either or both cases, the one or more interfaces may be provided as interfaces for coupling the busbar(s) to one or more external busbars (i.e. busbars external to the PCB). In particular, the one or more interfaces may comprise one or more press-fit interfaces, which may be provided as press-fit screw terminals on the PCB body and/or the busbar(s). These allow routing the electric current and/or heat to and/or from the PCB.

The one or more interfaces 140, in particular as press-fit screw terminals, may be made of brass. They may further be surface-treated, where the material used may be electrically conducting material, such as tin. They may be configured for a press-fit screw element to be pressed into a hole located at the press-fit screw terminal for attachment. This allows forming a gas tight cold-welded joint. The press-fit terminal may utilize one or more holes in the PCB body for receiving the press-fit screw element. The screw element and the screw terminal may both be coated with the same material, such as tin. On the other hand, some or all of the screw terminals may be provided at a metal-plated, e.g. gold-plated, PCB body and/or at embedded conductive plate(s), such as the one or more busbars 130, e.g. copper busbar(s). When a tin-coated press-fit screw element is pressed into such a screw terminal, the coating on the press-fit element can act as a lubricant during the pressing process due to its plastic properties.

Some or all of the one or more interfaces 140, e.g. press-fit screw terminals, may be integral with the one or more busbars 130. On the other hand, some or all of the interface 140, e.g. press-fit screw terminals, may be bridged to the one or more busbars 134 by one or more electrical connectors.

The PCB 100 may also comprise one or more current measuring elements 142, such as a shunt resistor. These may be provided as surface-mount components. The current measuring element(s) may be attached to the one or more busbars for measuring the electric current through the busbar(s). They may be directly attached to the busbar(s), for example as surface mount(s). The attachment may be done by solder(ing). The PCB may comprise one or more comparator(s) coupled to the current measuring element(s) and the one or more switches for facilitating opening any or all of the one or more switches. The PCB may be configured to open the switch(es) when an electric current at the current measuring element(s) exceeds a threshold value. An electronic fuse can thus be provided at the PCB by the current measuring element(s) and the comparator(s). The electronic fuse(s) may be configured with a first threshold value for opening the switch(es) for an instantaneous electric current such as a fault current. The first threshold value may be over 300 amperes, for example 1000 amperes or more. The comparator may have different threshold values depending on current direction. For example, it may have a charging threshold for charging current and/or a discharging threshold for discharging current, where the charging threshold may be larger or smaller than the discharging threshold.

Alternatively or additionally, the PCB 100 may also be arranged for acting as an electric fuse for a continuous electric current. For this purpose, the current measuring element(s) 142, for example in accordance with any of the examples described above, may be utilized so that they are coupled to one or more processor, such as a microprocessor, for processing measurement results from the current measuring element(s). The processor(s) may be comprised at the PCB, in particular on the PCB body. The processor(s) may be configured for facilitating opening of the switch(es) when a continuous electric current at the current measuring element(s) exceeds a second threshold value. The processor may comprise an analog-to-digital converter for reading measurement signals from the current measuring element(s). The second threshold value may be 100 amperes or more, for example more than 200 or 300 amperes. The PCB 100 may comprise one or more connections to a cooling element for transmitting heat from the busbar(s) acting as a heat sink for cooling. These may comprise, for example, one or more mask openings 150 allowing the busbar(s) to be connected to the cooling element, for example through a thermal gap pad. The busbar(s) may be directly coupled to their own cooling element. The cooling element may be dedicated to the busbar. The cooling element may be external to the PCB. The connection may be configured in thermal contact with the busbar to maximize heat transfer from the busbar while minimizing electric current through the connection. For this purpose, the connection may comprise a layer of electrically insulating thermal interface material. For example, the PCB may comprise one or more thermal gap pads for such a purpose, in particular at the one or more mask openings 150. The cooling element may be, for example, a liquid cooling element, such as an aluminum extruded liquid cooling element. The cooling element may comprise a liquid cooling element and/or an air-cooling element. The cooling element may comprise or consist of a passive cooling element, such as a cooling plate, and/or an active cooling element.

It is noted that in some applications, the one or more busbars 130 themselves may provide sufficient cooling so that no further cooling elements are required. However, in some applications the routing of electric current may cause resistive losses increasing the need for additional cooling.

In FIG. 1a the one or more busbars 130 and the switching interface 122 are illustrated with dotted lines as they may be partially or fully masked on one or both sides of the PCB body 110. Accordingly, any busbar disclosed herein may be at least partially masked by a soldering mask on its top and/or bottom surface. The mask openings can be formed as an openings to the soldering mask. On the other hand, in FIG. 1b the same busbars 130 as in FIG. 1a are illustrated from another side 132 with solid lines as they may be partially or fully exposed on one or both sides of the PCB body, e.g. through a mask opening 150 (corresponding to the region outlined by the solid lines but illustrated with superimposed dashed lines for increased attention). While the one or more busbars are thus embedded within the PCB body and while a mask such as a soldering mask can be utilized to at least partially mask the busbar(s), the busbar(s) are not covered by the PCB body, e.g. by PCB surface layers. The uncovered surface of the busbar(s) may comprise at least partially but in particular substantially fully the top and/or bottom surface of the busbar(s). Here, the uncovered surface may still be partially or fully masked, in particular by a soldering mask, but it may also be partially or fully exposed, i.e. without any mask and open for contact.

Figure 2:
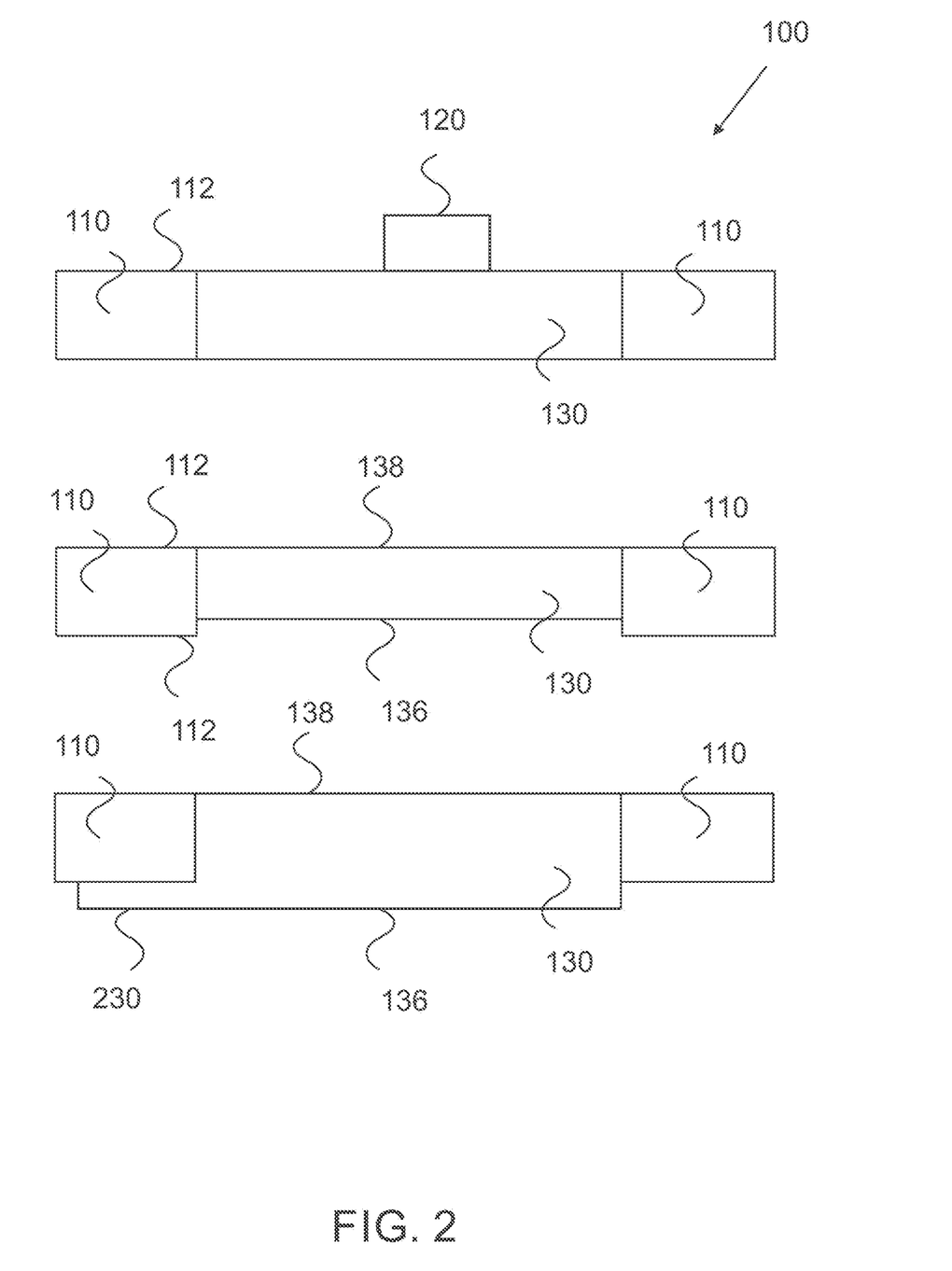
FIG. 2 illustrates PCBs according to three examples in a side view, FIG. 3 schematically illustrates an electric vehicle and a load switching unit according to an example.

FIG. 2 illustrates PCBs 100 according to three examples in a side view. In accordance with the uppermost example, some or all of the one or more busbars 130 can be embedded into the PCB body 110 so that they are flush on both sides with the surface 112 of the PCB body. The one or more busbars can thus extend throughout the thickness of the PCB body allowing a busbar-embedded PCB to be readily provided. The thickness of the busbar(s) in this example can be substantially equal to the thickness of the PCB body.

In accordance with the center example, the one or more busbars 130 can embedded into the PCB body 110 so that they are recessed with respect to the surface 112 of the PCB body on one or both sides of the PCB body. In the latter case, the thickness of the one or more busbars is smaller than the thickness of the PCB body, whereas in the former case, it may be smaller but even equal or larger. While one surface 136, e.g. the bottom surface, of the busbar(s) may be recessed with respect to the surface 112 of the PCB body, the other (opposing) surface 138, e.g. the top surface, may still be flush with the surface 112 of the PCB body. Alternatively, the other surface 138 may also be recessed or protruding with respect to the surface 112 of the PCB body.

In accordance with the lowermost example, the one or more busbars 130 can be embedded into the PCB body 110 so that they are protruding with respect to the surface 112 of the PCB body on one or both sides of the PCB body. In the latter case, the thickness of the one or more busbars is larger than the thickness of the PCB body, whereas in the former case, it may be larger but even equal or smaller. While one surface 136, e.g. the bottom surface, of the busbar(s) may be protruding with respect to the surface 112 of the PCB body, the other (opposing) surface 138, e.g. the top surface, may still be flush with the surface 112 of the PCB body. Alternatively, the other surface 138 may also be protruding or recessed with respect to the surface 112 of the PCB body. When the one or more busbars protrude with respect to the surface 112 of the PCB body, they may have one or more extensions 230 overlapping the PCB body for transmitting electric current and/or heat. The extension(s) may be monolithic with the busbar(s), and thereby of the same material. Alternatively, the extension(s) may be provided independent of the busbar(s).

In all of the examples indicated herein, the one or more switches 120 can be directly attached to the one or more busbars 130, in particular by solder/soldering. Any PCB surface layers and prepregs between the switch(es) and the busbar(s) can thus be omitted. As a result, no feedthroughs are required. The direct contact can thus be manifested not only as direct physical contact but as direct electrical and thermal contact as well. In some alternative embodiments, the switch(es) may be attached to the busbar(s) by laser welding.

Figure 3:
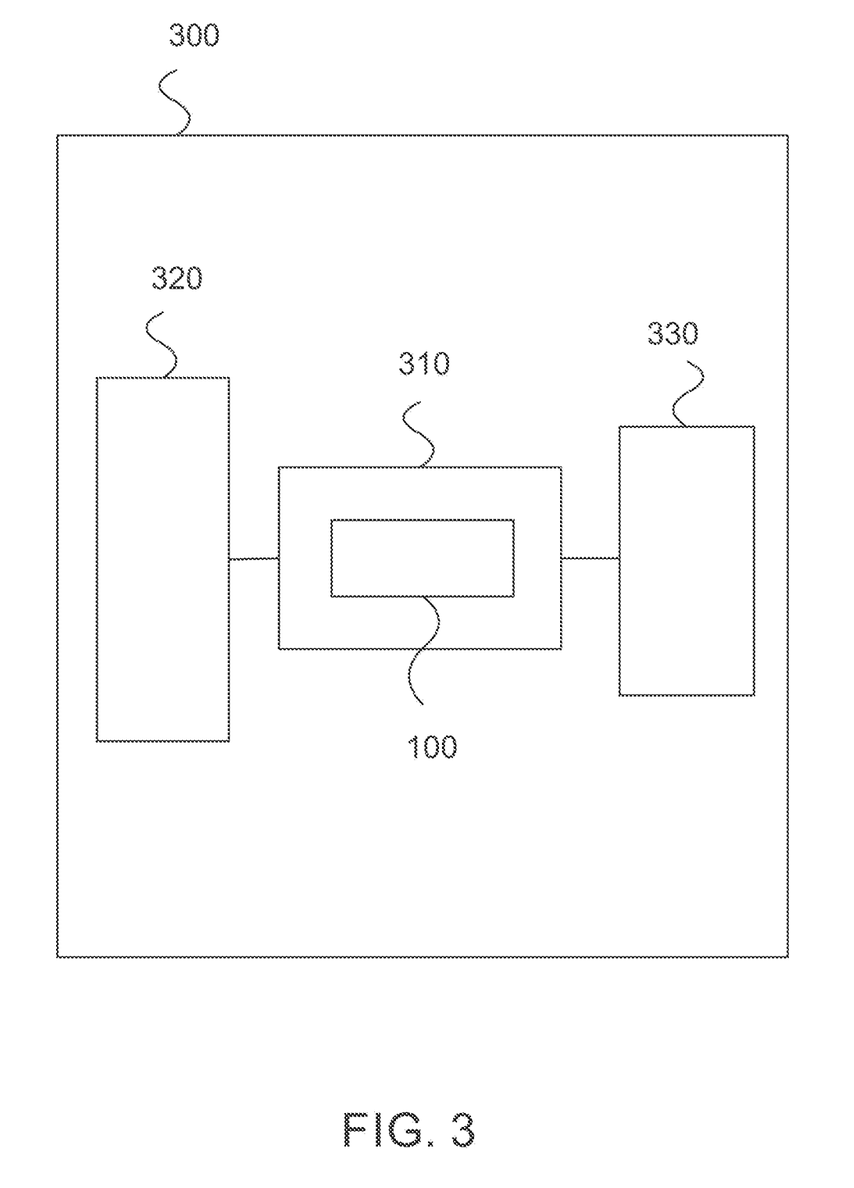

FIG. 3 illustrates an electric vehicle 300 and a load switching unit 310 according to an example.

The load switching unit 310 comprises one or more PCBs as disclosed herein. They can be configured for load switching between a power supply 320 and one or more loads 330. The power supply may comprise or consist of one or more battery packs, in particular those of an electric vehicle. These may provide drive batteries for propulsion of the electric vehicle. The batteries for the battery pack(s) may comprise or consist of Li-ion batteries, for example. The one or more loads may comprise or consist of a dc link of the electric vehicle.

The electric vehicle 300 may comprise the load switching unit 310. It may also comprise the power supply 320 and/or the load(s) 330. The load switching unit may be configured for load switching between the power supply for propulsion of the electric vehicle and the load(s). The electric vehicle referred to in any context herein may be, in particular, an electric car. The electric vehicle may be a battery electric vehicle (BEV) powered exclusively through one or more electric motors or it may be a hybrid electric vehicle (HEV). The electric vehicle may be a plug-in electric vehicle.

Figure 4:
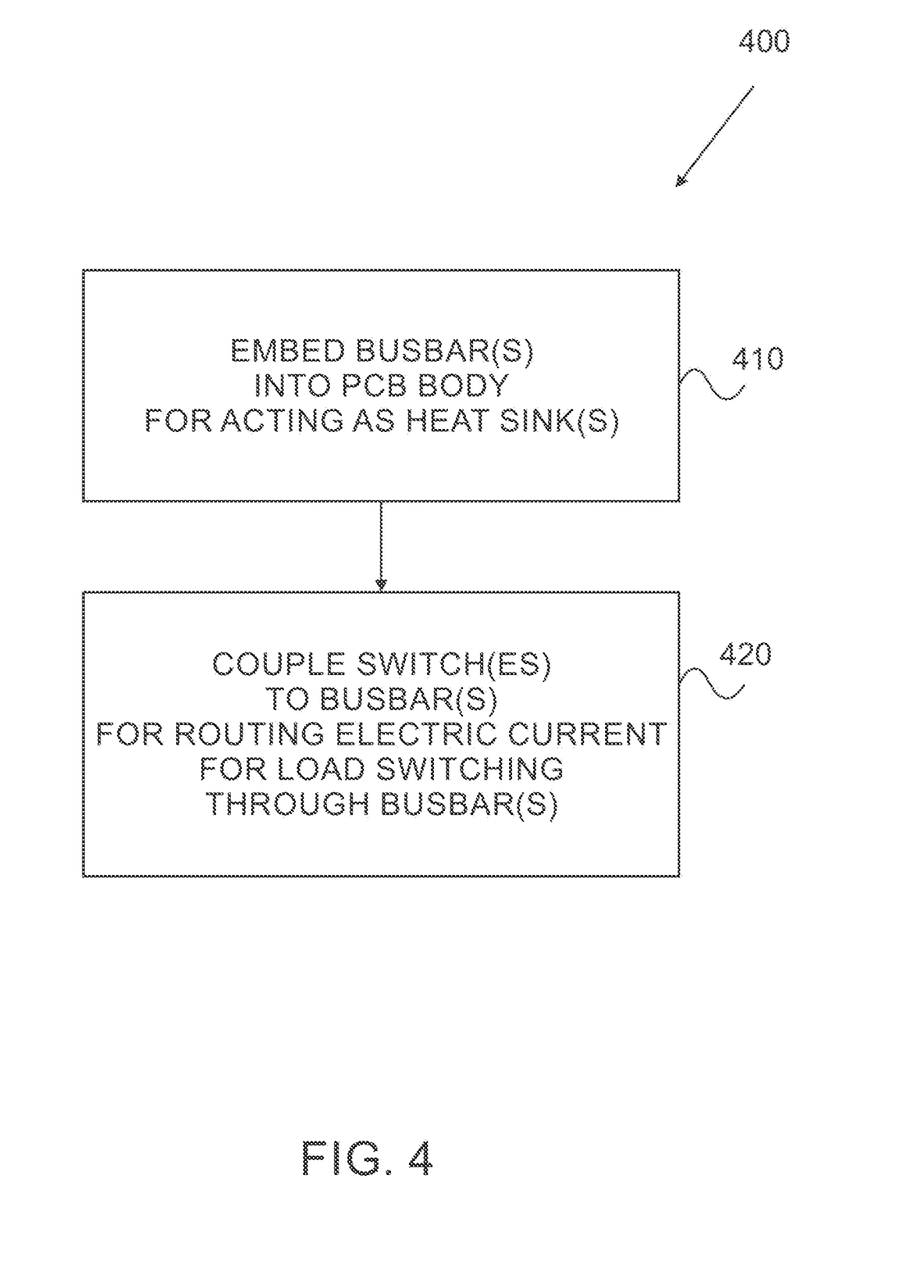
FIG. 4 illustrates a method according to an example.

FIG. 4 illustrates a method 400 according to an example. The method can be used for providing a PCB for load switching between an electric power supply and one or more loads. The PCB may be a PCB 100 in accordance with any of the examples disclosed herein.

The method 400 comprises embedding 410 one or more busbars 130 into a PCB body 110 for acting as heat sink(s). The method may further comprise coupling 420 one or more switches 120 to the busbar(s) for routing an electric current for load switching through the busbar(s). All features mentioned in connection of the PCB 100 disclosed herein may be applied also in connection with the method.

Figure 5:
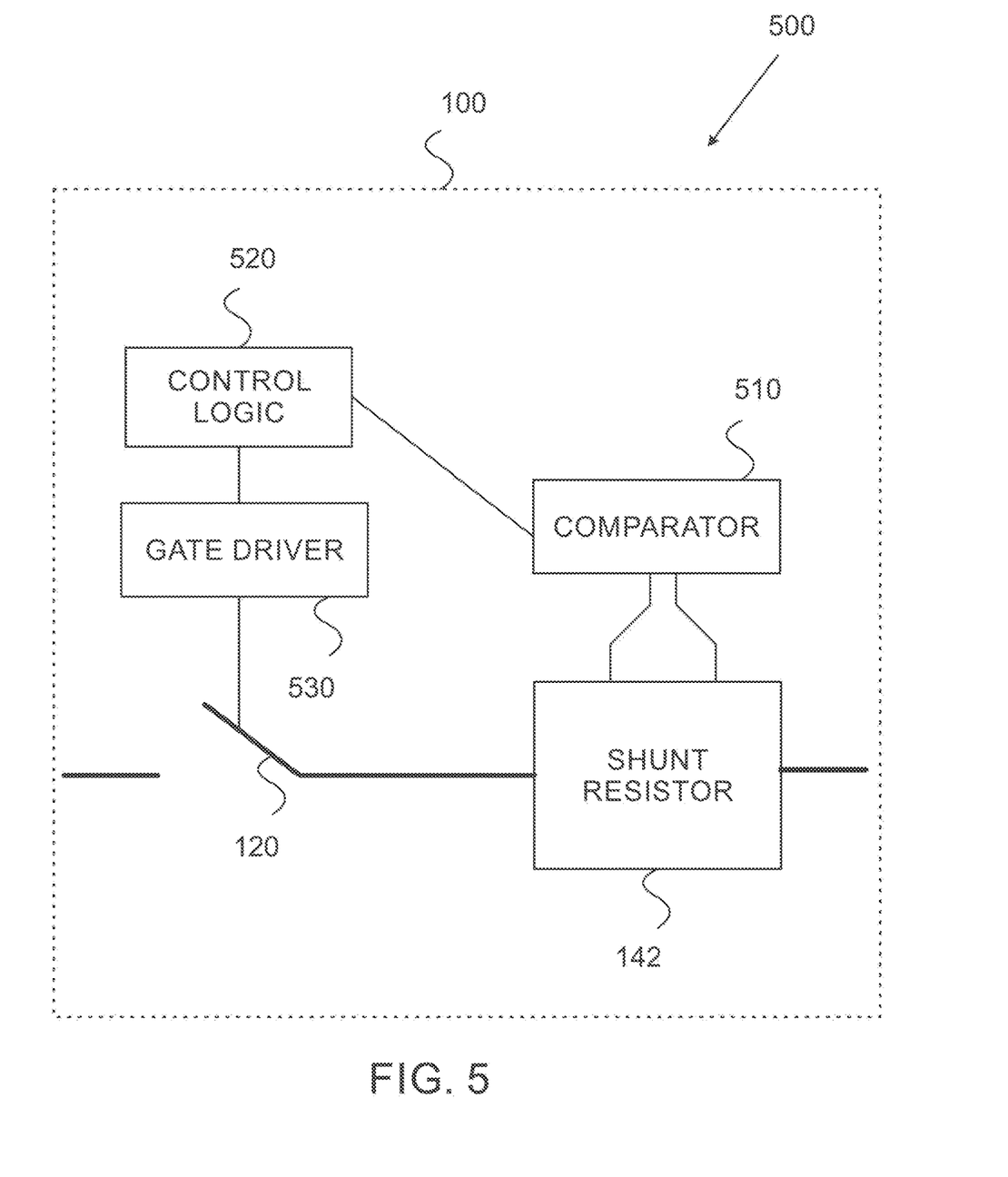
FIG. 5 illustrates an electronic fuse according to an example.

FIG. 5 illustrates an example of providing an electronic fuse 500 on the PCB 100. The one or more switches 120 are coupled through the one or more busbars to the current measuring element 142, such as a shunt resistor. The coupling can be done, for example, as described above with reference to FIG. 1, e.g. as a direct attachment of the current measuring element(s) to the busbar(s). The PCB may also comprise the comparator(s) 510, which can be coupled to the current measuring element(s) for determining whether an electric current at the current measuring element(s), and thereby at the busbar(s), exceeds the first threshold value. The comparator(s) may be coupled to the switch(es) so that the switch(es) can be opened when the threshold value is exceeded. Alternatively or additionally, the PCB may comprise the processor(s), e.g. as described above, configured to facilitate opening of the switch(es) when a continuous electric current at the current measuring element(s) exceeds a second threshold value. The comparator(s) can thus be included for facilitating opening of the switch(es) based on an instantaneous current at the current measuring element(s) exceeding the first threshold value and/or the processor(s) may be included (and configured) for facilitating opening of the switch(es) based on a continuous current at the current measuring element(s) exceeding the second threshold value. The PCB may be configured to do either or both of these automatically. For this purpose, a control logic 520 and/or a gate driver 530 may be used, which may be comprised at the PCB, for example provided on the PCB body. The control logic and/or the gate driver may be configured for controlling the opening of the switch(es). The control logic may comprise the processor(s).

The different functions discussed herein may be performed in a different order and/or concurrently with each other.

Any range or device value given herein may be extended or altered without losing the effect sought, unless indicated otherwise. Also any example may be combined with another example unless explicitly disallowed.

Although the subject matter has been de-scribed in language specific to structural features and/or acts, it is to be understood that the subject matter defined in the appended claims is not necessarily limited to the specific features or acts de-scribed above. Rather, the specific features and acts described above are disclosed as examples of implementing the claims and other equivalent features and acts are intended to be within the scope of the claims.

It will be understood that the benefits and advantages described above may relate to one embodiment or may relate to several embodiments. The embodiments are not limited to those that solve any or all of the stated problems or those that have any or all of the stated benefits and advantages. It will further be understood that reference to 'an' item may refer to one or more of those items.

The term 'comprising' is used herein to mean including the method, blocks or elements identified, but that such blocks or elements do not comprise an exclusive list and a method or apparatus may contain additional blocks or elements.

Numerical descriptors such as 'first', 'second', and the like are used in this text simply as a way of differentiating between parts that otherwise have similar names. The numerical descriptors are not to be construed as indicating any particular order, such as an order of preference, manufacture, or occurrence in any particular structure.

Although the invention has been described in conjunction with a certain type of apparatus and/or method, it should be understood that the invention is not limited to any certain type of apparatus and/or method. While the present inventions have been described in connection with a number of examples, embodiments and implementations, the present inventions are not so limited, but rather cover various modifications, and equivalent arrangements, which fall within the purview of the claims. Although various examples have been described above with a certain degree of particularity, or with reference to one or more individual embodiments, those skilled in the art could make numerous alterations to the disclosed examples without departing from the scope of this specification.

The invention claimed is:

1. A printed circuit board (PCB) for load switching between an electric power supply and one or more loads, the PCB comprising: a PCB body; a busbar embedded into the PCB body for acting as a heat sink; one or more switches for the load switching, wherein the one or more switches are coupled to the busbar for routing an electric current for the load switching through the busbar; and a connection to a cooling element, the connection being configured in thermal contact with the busbar, wherein the connection comprises a layer of electrically insulating thermal interface material.

2. The PCB according to claim 1, wherein the one or more switches are directly attached to the busbar.

3. The PCB according to claim 1, wherein the one or more switches are soldered to the busbar.

4. The PCB according to claim 1, wherein the busbar extends throughout a thickness of the PCB body.

5. The PCB according to claim 1, wherein a thickness of the busbar is substantially equal to a thickness of the PCB body.

6. The PCB according to claim 1, wherein the one or more switches are one or more semiconductor switches.

7. The PCB according to claim 1, wherein the busbar is a copper busbar.

8. The PCB according to claim 1, further comprising: one or more press-fit screw terminals on one or more of the PCB body or the busbar for routing the electric current from the PCB.

9. The PCB according to claim 1, further comprising: a current measuring element together with one or more of a comparator or a processor coupled to the one or more switches and to the busbar via the current measuring element for facilitating opening any or all of the one or more switches when an electric current at the current measuring element exceeds a threshold value.

10. The PCB according to claim 9, wherein the current measuring element comprises a shunt resistor directly attached to the busbar.

11. A load switching unit for an electric vehicle, comprising one or more PCBs according to claim 1 for load switching between a battery pack of the electric vehicle and a dc link of the electric vehicle.

12. An electric vehicle comprising one or more batteries for propulsion of the electric vehicle and the PCB according to claim 1 for load switching for the one or more batteries.

13. A method of providing a printed circuit board (PCB) for load switching between an electric power supply and one or more loads, the method comprising: embedding a busbar into a PCB body for acting as a heat sink; connecting the busbar to a cooling element with a connection that is in thermal contact with the busbar, the connection included a layer of electrically insulating thermal interface material; and coupling one or more switches to the busbar for routing an electric current for the load switching through the busbar.

* * * * *